(12) United States Patent
Adams et al.

(10) Patent No.: US 6,907,554 B2
(45) Date of Patent: Jun. 14, 2005

(54) BUILT-IN SELF TEST SYSTEM AND METHOD FOR TWO-DIMENSIONAL MEMORY REDUNDANCY ALLOCATION

(75) Inventors: R. Dean Adams, St. George, VT (US); Thomas J. Eckenrode, Endicott, NY (US); Steven L. Gregor, Endicott, NY (US); Gary S. Koch, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 217 days.

(21) Appl. No.: 10/249,817

(22) Filed: May 9, 2003

(65) Prior Publication Data

US 2004/0225939 A1 Nov. 11, 2004

(51) Int. Cl.$^7$ ................................................ G11C 29/00
(52) U.S. Cl. ........................ 714/718; 714/711; 714/704; 365/201
(58) Field of Search ................................. 714/703, 704, 714/710, 711, 718, 719, 723, 733, 734, 735, 736, 5, 7, 48, 54, 819, 824; 365/200, 201; 711/200, 206, 211

(56) References Cited

U.S. PATENT DOCUMENTS

| | | | |
|---|---|---|---|
| 4,751,656 A | 6/1988 | Conti et al. .................. 364/488 |
| 5,640,354 A * | 6/1997 | Jang et al. .................. 365/201 |
| 6,026,505 A | 2/2000 | Hedberg et al. ............. 714/711 |
| 6,065,134 A | 5/2000 | Bair et al. ...................... 714/7 |
| 6,073,258 A | 6/2000 | Wheater ...................... 714/718 |
| 6,256,757 B1 | 7/2001 | Arkin .......................... 714/718 |
| 6,259,636 B1 | 7/2001 | Fukuda et al. .............. 365/200 |
| 6,304,989 B1 | 10/2001 | Kraus et al. ................ 714/733 |
| 6,373,758 B1 * | 4/2002 | Hughes et al. .............. 365/200 |
| 6,525,987 B2 * | 2/2003 | Hilbert .................. 365/230.06 |
| 6,829,181 B1 * | 12/2004 | Seitoh ........................ 365/201 |

* cited by examiner

Primary Examiner—Christine T. Tu
(74) Attorney, Agent, or Firm—Downs Rachlin Martin PLLC

(57) ABSTRACT

A built-in self test system (124) and method for two-dimensional memory redundancy allocation. The built-in self test system is adapted to allocate two redundant columns (116) and one redundant row (120) to an embedded memory (104) as needed to repair single cell failures (SCFs) within the rows (108) and columns of the memory. The self-test system includes a left-priority encoder (136), a right-priority encoder (140), and a greater-than-two detector (144). The left-priority encoder encodes the location of the first SCF most proximate the most-significant bit of the corresponding word. The right-priority encoder encodes the location of the first SCF most proximate the least-significant bit of the corresponding word. The greater-than-two detector determines whether a word contains more than two SCFs. If the greater-than-two detector detects that a word contains more than two SCFs, the built-in self test system identifies the corresponding row as being a must-fix row, since the number of SCFs exceeds the number of redundant columns.

20 Claims, 21 Drawing Sheets

BUILT-IN SELF TEST SYSTEM AND METHOD FOR TWO-DIMENSIONAL MEMORY REDUNDANCY ALLOCATION

BACKGROUND OF INVENTION

Field of the Invention

The present invention relates generally to the field of integrated circuit memories. More particularly, the present invention is directed to built-in self test system and method for two-dimensional memory redundancy allocation.

Redundancy is desirable in memories to increase the yield of semiconductor chip production. Semiconductor memories typically comprise very dense circuitry. Due to this high density, memories are relatively susceptible to damage by subtle defects that logic circuits are largely immune from. Thus, yield can be improved by including redundant memory elements, e.g., cells, rows, columns, and I/Os, to replace the corresponding elements containing one or more damaging defects. For example, it is not uncommon for a chip yield to be 25% without redundancy, 50% with row redundancy, and 70% with two-dimensional (row and column) redundancy. Further, it is not uncommon to see very low yields with insufficient redundancy, sometimes below 1%.

Memory chips are typically tested for defects using testing equipment that is external to the chips. Embedded memories, i.e., the one or more memories on board logic and other chips, on the other hand, generally cannot be tested with external equipment. This is so because embedded memories typically do not have any external I/O contacts accessible to external testing equipment. Rather, the I/Os of embedded memories are themselves embedded and communicate directly with the pertinent other circuitry on board the chips, e.g., logic circuitry. It would be impractical, if not impossible, to provide external I/O contacts linked to the embedded I/Os due to the limited amount of space available for wiring the external contacts and internal I/Os to one another for interfacing with testing equipment. Compounding the problem is the fact that many chips containing embedded memory have several memories located at various locations throughout the chips. For these reasons, it is generally most practical to test embedded memories using built-in self test (BIST) circuitry provided on board these chips.

Most SRAMs having redundancy typically have only a single dimension of redundancy implemented using spare rows. When a failure is detected during the test of a given word, the BIST replaces the row containing that word with one of the spare rows. In this manner, all of the words in the defective row are replaced, despite the fact that only one word, or even cell, within that row may have failed. Single-dimensional redundancy works well with a BIST, since it is generally a simple matter to detect a failing word on each word readback from the memory to the BIST circuitry.

FIG. 1 shows a conventional pass/fail comparator 10 for implementing a single-row BIST that includes a simple XOR-OR tree 12 that compares a word 14 (e.g., a 72-bit word) from a row of memory (not shown) with the expected value 18 of that word. This comparison is performed local to memory. Pass/fail comparator 10 generates a pass/fail signal 22 that is sent to the BIST, where the redundancy calculation is stored.

Two-dimensional redundancy has been implemented on DRAMs, SRAMs, and CAMs when required, but is not widely utilized unless absolutely needed due to the relatively high amount of overhead required. FIG. 2 illustrates a conventional circuit 30 for implementing a two-dimensional BIST that includes a plurality of XOR comparators 34 that each compare a bit 36 of word 38 from a row of memory (not shown) with the expected value 42 of that bit. To include column redundancy in its redundancy allocation scheme, circuit 30 further includes a counter 46 for each bit 36 of word 38. A "column" of words is read from row 0 to row n, starting from row 0 and proceeding to row n. Any failing bit(s) 36 in each word 38 are accumulated in counters 46 until the "top" of the memory, i.e., row n, is reached, at which point the data from the counters are read out to the BIST and the counters are reset for testing of the next column of words. The BIST then determines which column (s), if any, of the memory should be replaced by the spare column(s). For example, column 3 may have four failing bits, one in each of four separate words, whereas columns 24 and 61 may each have only 1 failing bit. Accordingly, BIST would determine that column 3 should be replaced with a spare column. Depending upon the availability of spare columns and rows, columns 24 and/or 61 may be replaced with corresponding spare columns or the corresponding row(s) containing the failing bits may be replaced with corresponding spare row(s). If there are more failing rows and columns than spare rows and columns, the memory cannot be repaired. Obviously, the amount of circuit overhead to implement counters 46 (e.g., approximately 4700 cells for a 72-bit word read for the counters and associated clock splitters, etc.), along with the problem of unloading the counters before continuing the BIST testing, creates challenges.

SUMMARY OF INVENTION

In one aspect, the present invention is directed to an integrated circuit device comprising a memory that includes a plurality of redundant columns and a plurality of words each having a most significant bit location and a least-significant bit location. The integrated circuit device further comprises a built-in self test system for detecting failed bit locations within the memory. The built-in self test system includes a first encoder adapted for generating a first encoded value corresponding to a first failed bit location most proximate the most significant bit location. A second encoder is adapted for generating a second encoded value corresponding to a second failed bit location most proximate the least-significant bit location. A built-in self test adapted for allocating at least one of the plurality of redundant columns based upon the first and second encoded values.

In another aspect, the present invention is directed to a system for testing a memory of an integrated circuit device and allocating one or more of a plurality of redundant elements to one or more failed bit locations. The system comprises a built-in self tester adapted for testing a plurality of word locations within the memory. A first encoder performs a most-significant bit encode with respect to each of the plurality of word locations having at least one failed bit location. A second encoder performs a least-significant bit encode with respect to each of the plurality of word locations having at least one failed bit location. The first and second encoder are in electrical communication with the built-in self tester.

BRIEF DESCRIPTION OF DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION

Figure 3:
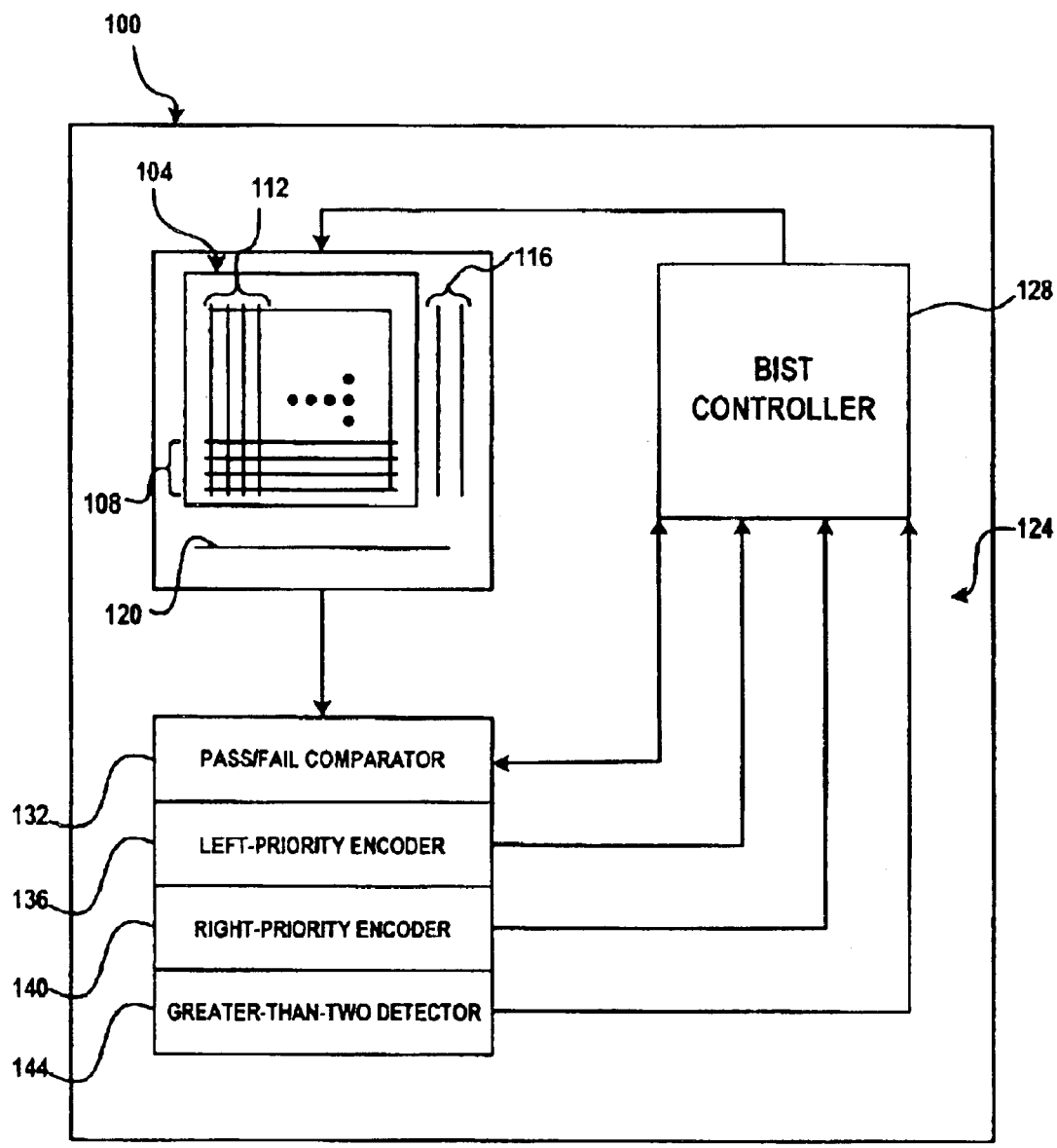
FIG. 3 is a simplified schematic diagram of a chip of the present invention containing a two-dimensional BIST system for testing a memory for single cell failures and allocating two spare columns and one spare row to the single cell failures in attempt to repair the memory.
Figure 4:
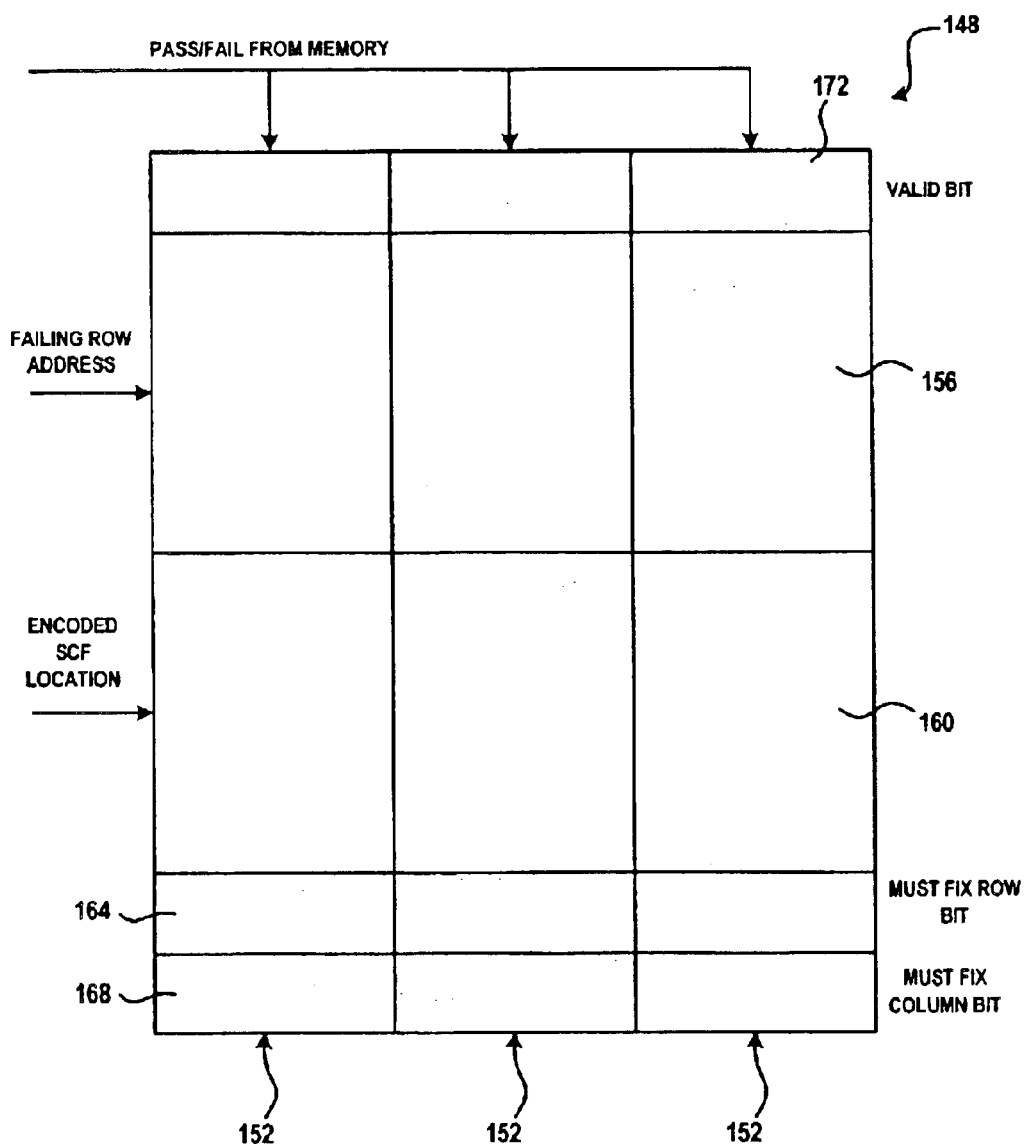
FIG. 4 is a simplified schematic diagram of a failed address register that may be used in conjunction with the BIST system of FIG. 3.

Referring now to FIGS. 3 and 4 of the drawings, FIG. 3 shows in accordance with the present invention an integrated circuit (IC) chip, which is identified generally by the numeral 100. Chip 100 may be any type of IC chip that contains a memory 104, such as an embedded memory. For example, chip 100 may be a logic chip, an application specific IC (ASIC) chip, or microprocessor chip, among others. Memory 104 may be any type of IC memory, such as SRAM, DRAM, or CAM, among others. Memory 104 may include a plurality of rows 108 and a plurality of columns 112 and have two-dimensional redundancy, i.e., has one or more spare rows and one or more spare columns. In the present example, memory includes 128 rows 108 and 72 columns 112, with only several of these rows and columns being shown for illustration purposes, and has two spare columns 116 and one spare row 120. However, as those skilled in the art will appreciate, this configuration of memory 104 is merely illustrative. Memory 104 may have any number of rows 108 and columns 112, as well as any number of spare columns 116 and rows 120. Depending upon the configuration of memory 104, columns 112 and spare columns 116 may be bit lines or I/Os each comprising multiple bit lines and a multiplexer (not shown).

Chip 100 further includes an integrated built-in self test (BIST) system 124 that may be used to test memory 104 for single cell failures (SCFs), i.e., failed bit locations, caused by chip defects and to allocate the spare rows and columns provided in the memory, e.g., spare row 120 and columns 116, to the SCFs in attempt to repair the memory. BIST system 124 of the present invention provides for a large reduction in the amount of circuitry needed to perform redundancy calculations, simplifies the calculation process, and reduces the time required to test memory, when compared to conventional BIST systems.

BIST system 124 may include a BIST controller 128, a pass/fail comparator 132, a left-priority encoder 136, a right-priority encoder 140, and a greater-than-two failure detector 144. BIST controller 128 generally controls the operation of BIST system 124. As those skilled in the art will understand, functions that BIST controller 128 provides may include providing a test word to each of memory 104 and pass/fail comparator 132, storing information regarding SCFs, and allocating spare row 120 and/or columns 116, among other things.

BIST controller 128 may utilize a failed address register (FAR), such as FAR 148 of FIG. 4, for temporarily storing information needed for allocating spare row 120 and/or columns 116. FAR 148 may include a plurality of columns 152 for storing information about memory 104 provided by BIST system 124. Each column 152 may include fields for a failing row address 156, an encoded SCF location 160, a must-fix-row bit 164, a must-fix-column bit 168, and a valid-data bit 172. As discussed in more detail below, failing row address field 156 indicates the address of each row 108 of memory 104 that contains one or more SCFs, and encoded SCF location field 160 contains information regarding which one or more bit locations within a corresponding word have failed. Must-fix-row and must-fix-column bits 164, 168 are set when BIST system 124 determines that certain sets of SCFs require specific utilization of either spare row 120 or spare columns 116. For example, if two spare columns 116 are provided and a word within memory 104 has three SCFs, i.e., has three failing columns 112, such that the number of failed columns outnumbers the number of spare columns 116, BIST controller 128 determines that the three SCFs must be repaired with spare row 120.

Figure 1:
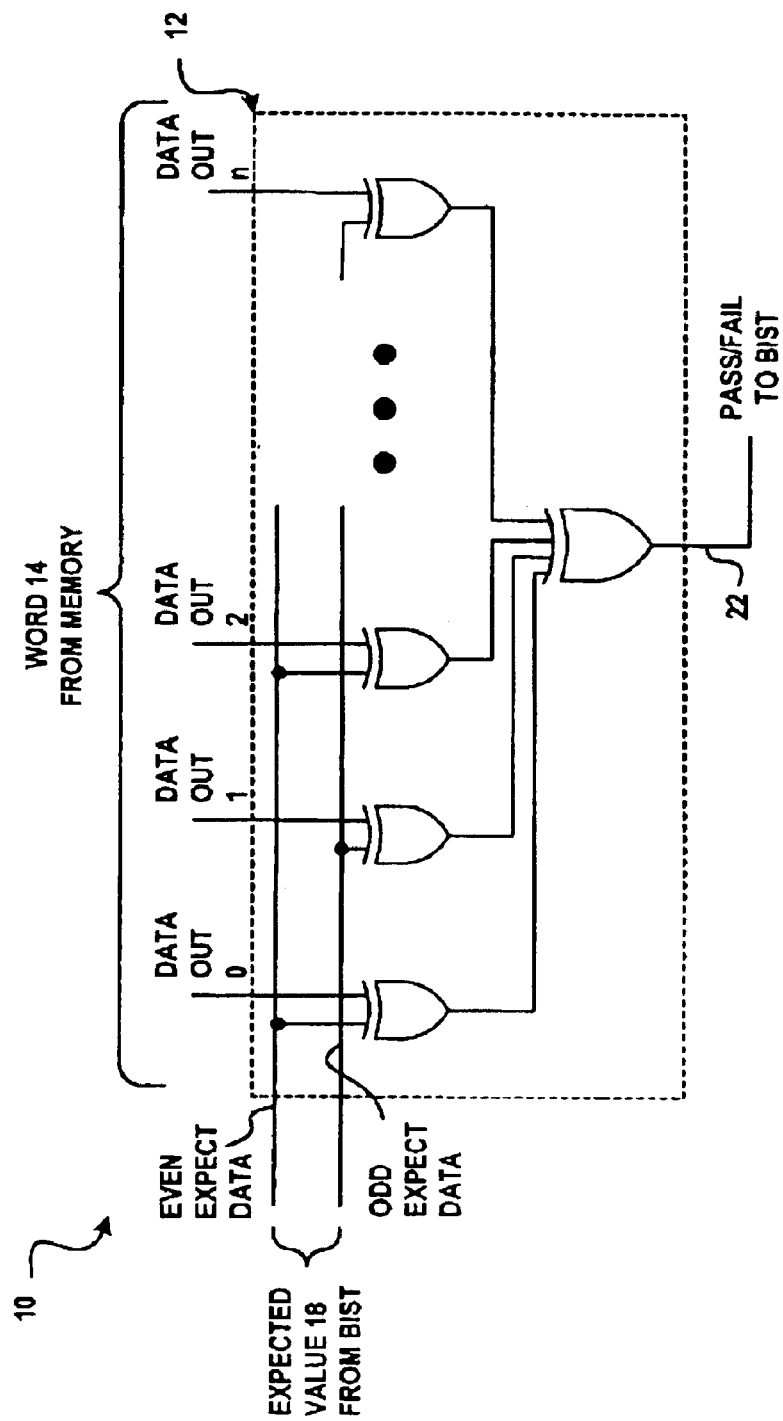
FIG. 1 is a logic diagram of a pass/fail comparator of a prior art one-dimensional BIST system for comparing data contained in a word read from a memory to data that word is expected to contain from the BIST for determining the presence of single cell failures within rows of the memory.
Figure 2:
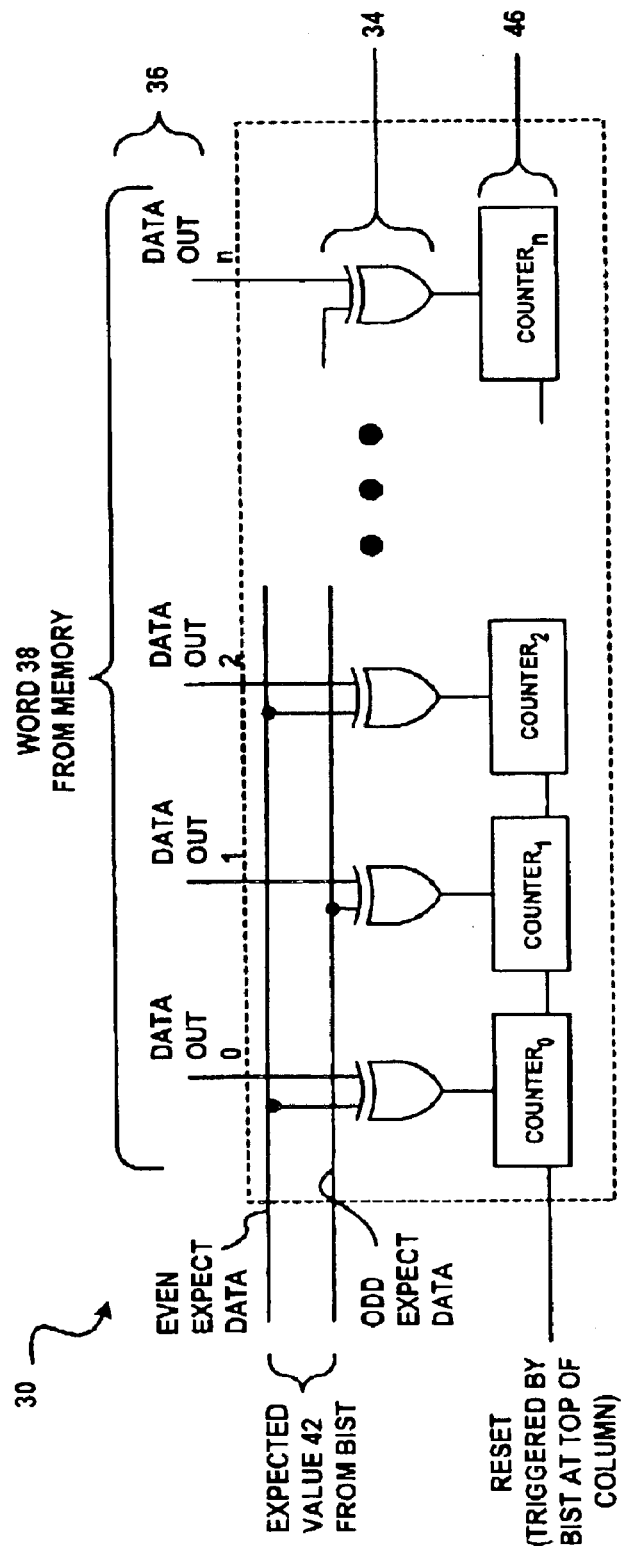
FIG. 2 is a logic diagram of a pass/fail comparator and columnar bit counters of a prior art two-dimensional BIST system for comparing data contained in a word read from memory to data that word is expected to contain from the BIST for determining the presence of single cell failures within rows of the memory and for determining the presence of more than one failure within each column of the memory.

Valid-data bit field 172 indicates that the data in the corresponding column 152 of FAR 148 is, in fact, valid and not just data resulting from whatever values that may be contained in the various other fields 156, 160, 164, 168. For example, if all bits in failing row address and encoded SCF location fields 156, 160 of the first column 152 were zero, without valid data bit 172 to indicate that this is valid data, these values could be interpreted as an SCF at bit location 0 within a word in row 0 of memory 104 when, in fact, no such failure exists. Pass/fail comparator 132 may be used to set valid-data bit 172 and may be implemented as illustrated in FIG. 1 with respect to prior art pass/fail comparator 10, if desired. That is, the output of pass/fail comparator 132 is a "0" when the data in a word read from memory 104 matches the expected data provided by BIST controller 128. Thus, when there are no SCFs in a given word, valid-data bit 172 is set to "0," which BIST controller 124 recognizes as indicating that any data in the corresponding column 152 of FAR 148 are not valid data. On the other hand, when one or more SCFs are detected in a word, the output of pass/fail comparator 132 is a "1." Correspondingly, valid-data bit 172 is set to "1," which BIST controller 128 recognizes as indicating the corresponding column 1152 contains valid SCF data.

As discussed below, left and right priority encoders 136, 140 may be used in conjunction with greater-than-two failure detector 144 to determine how many, if any, SCFs a word contains and, if the word contains one or two SCFs, what bit locations within that word, i.e., column(s) 112 of memory 104 the SCFs is/are in. Since there are two spare columns 116, it is necessary to know where the SCFs exist in a word having one or two SCFs. Greater-than-two detector 144 allows BIST controller 128 to determine whether or not more than two SCFs are present in any word. This is important, since in the present example only two spare columns 116 are provided. If a word has more than two SCFs, i.e., bit locations failing on more than two columns 112, the only way memory 104 can be repaired is to replace the row 108 containing the word having more than two SCFs with spare row 120. It will be apparent to those skilled in the art that if greater than two SCFs are detected in a word, must-fix-row bit 164 of FAR 148 must be set to indicate that row must be replaced with spare row 120.

Left-priority-encoder 136 may be an encoder that steps through the bit locations of each byte of each word being analyzed starting from the left-most (most-significant or high order) bit location and encodes the bit location of the first SCF encountered. Right-priority encoder 140 steps through the bit locations of each byte of each word starting from the right-most (least-significant or low order) bit and encodes the bit location of the first SCF it encounters. If a word contains only one SCF, left- and right-priority encoders 136, 140 return the same encoded value. For example, if SCF were at bit location 25, each of left- and right-priority encoders 136, 140 would provide a value of 25 (0011001). However, if word contains two SCFs, left- and right-priority encoders 136, 140 will encode two bit locations corresponding to the two SCFs. For example, if SCF were at bit locations 8 and 25, left- and right-priority encoders 136, 140 would provide values, respectively, of 8 (0001000) and 25 (0011001).

Figure 5:
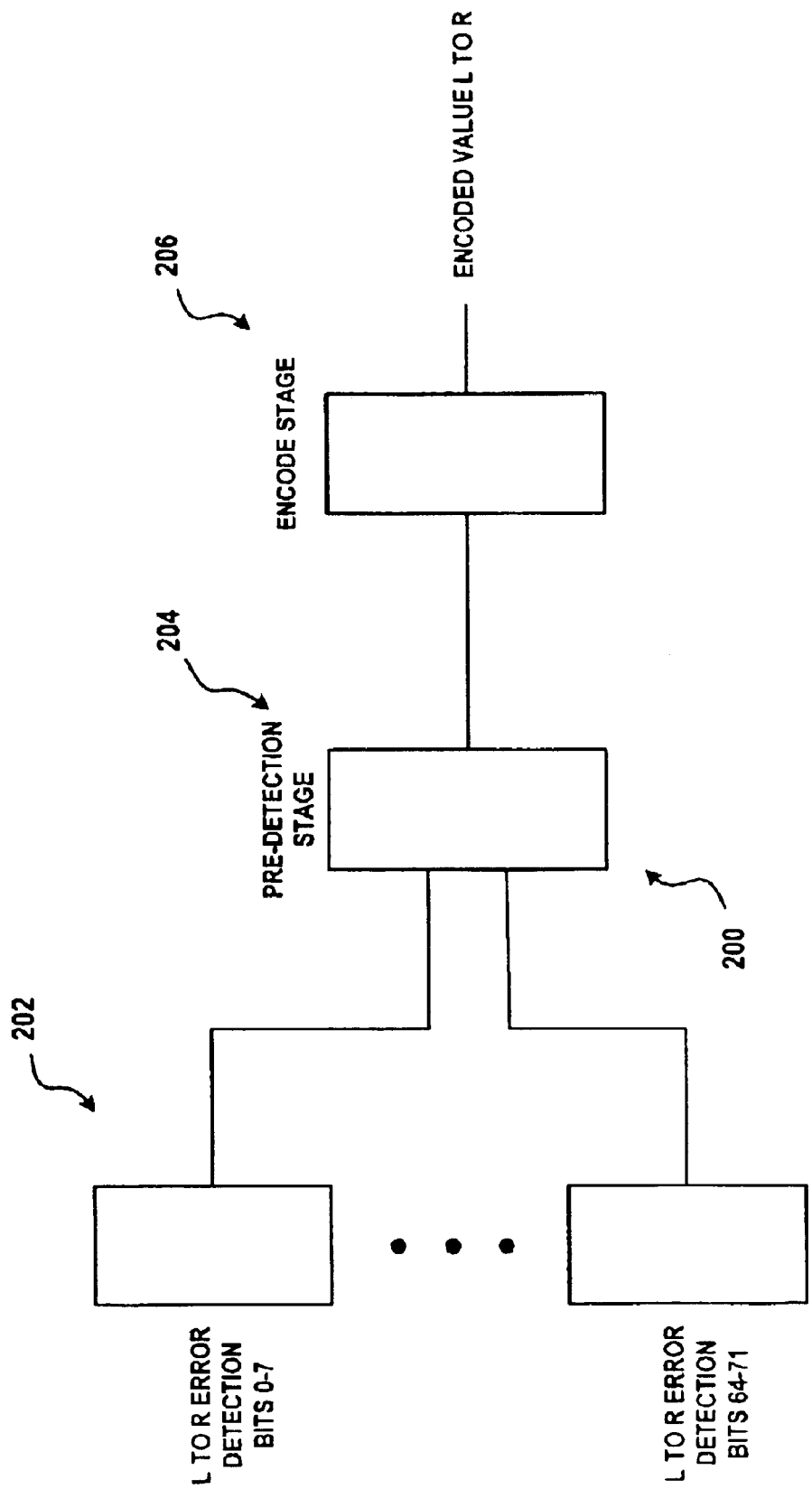
FIG. 5 is a simplified schematic diagram illustrating an overview of a logic scheme for a left-priority encoder that may be used in conjunction with the BIST system of FIG. 3.
Figure 6:
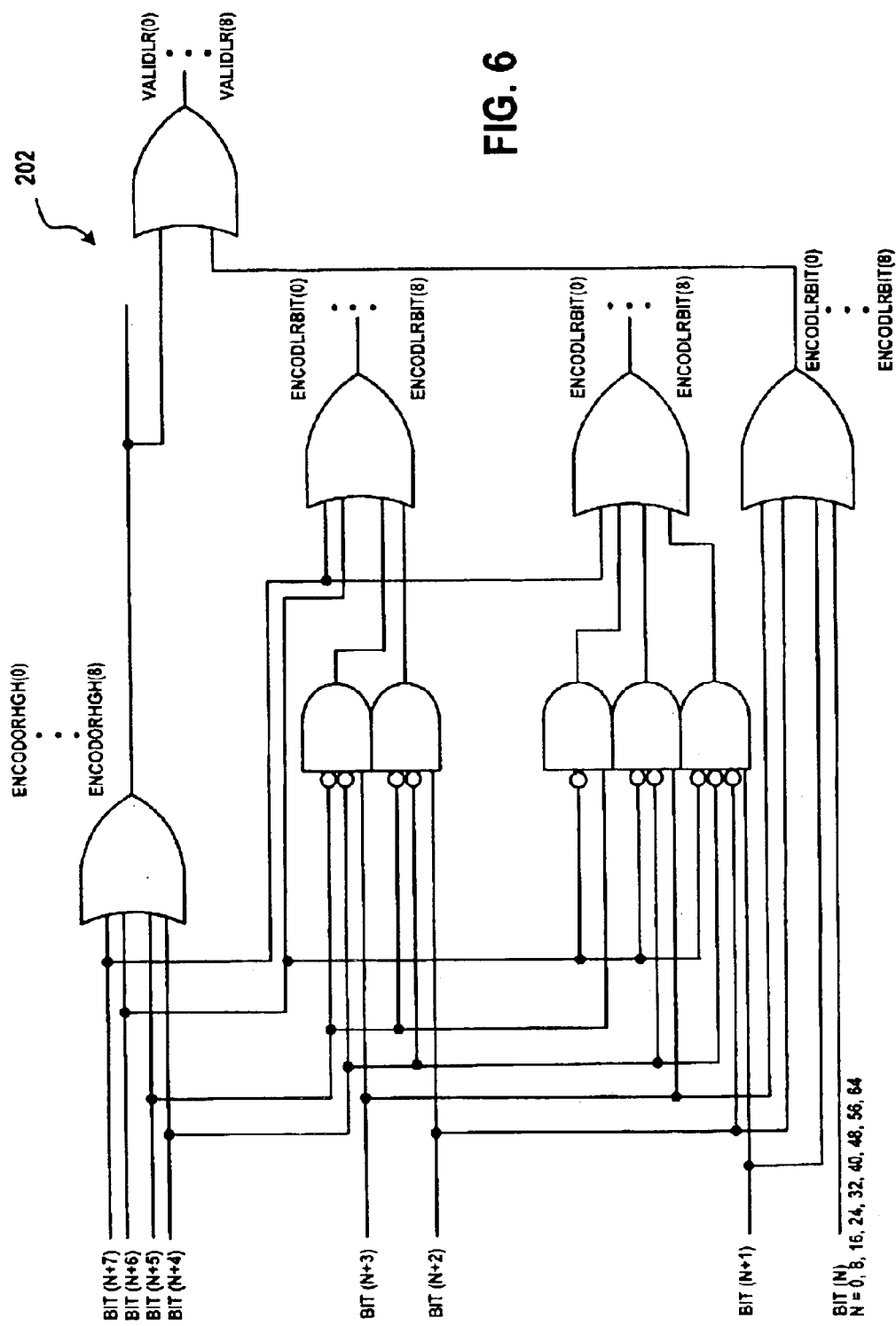
FIG. 6 is a logic tree for the error detection stage of the logic scheme for the left-priority encoder of FIG. 5.

FIG. 5 shows and example of logic 200 suitable for left-priority encoder 136 of FIG. 3 that encodes an eight-bit value corresponding to the location of the first SCF encountered in a 72-bit word. The logic for left-priority encoder 136 generally includes three stages, an error detection stage 200, a pre-detection stage 204, and an encode stage 208, the output of which is a left-to-right encoded value. As shown in FIG. 6, error detection stage 202 includes a logic tree for detecting an error in each of the nine bytes of the 72-bit word being analyzed. The logic tree is the same for each byte, with the input being a value of either "0" or "1" for each bit in that byte. A "0" indicates that an SCF did not occur in the corresponding bit location. A "1" indicates that an SCF did occur in that bit location. The output of this stage generally consisting of the variables VALIDLR(0–8), ENCODORHGH(0–8), ENCODLRBIT1 (0–8), and ENCODLRBIT0(0–8), each of which may have a value of either "0" or "1" depending upon the input values of the corresponding bits. These variables are used in pre-detection stage 204 and encode stage 206 of logic 200 of FIG. 5.

Figure 7:
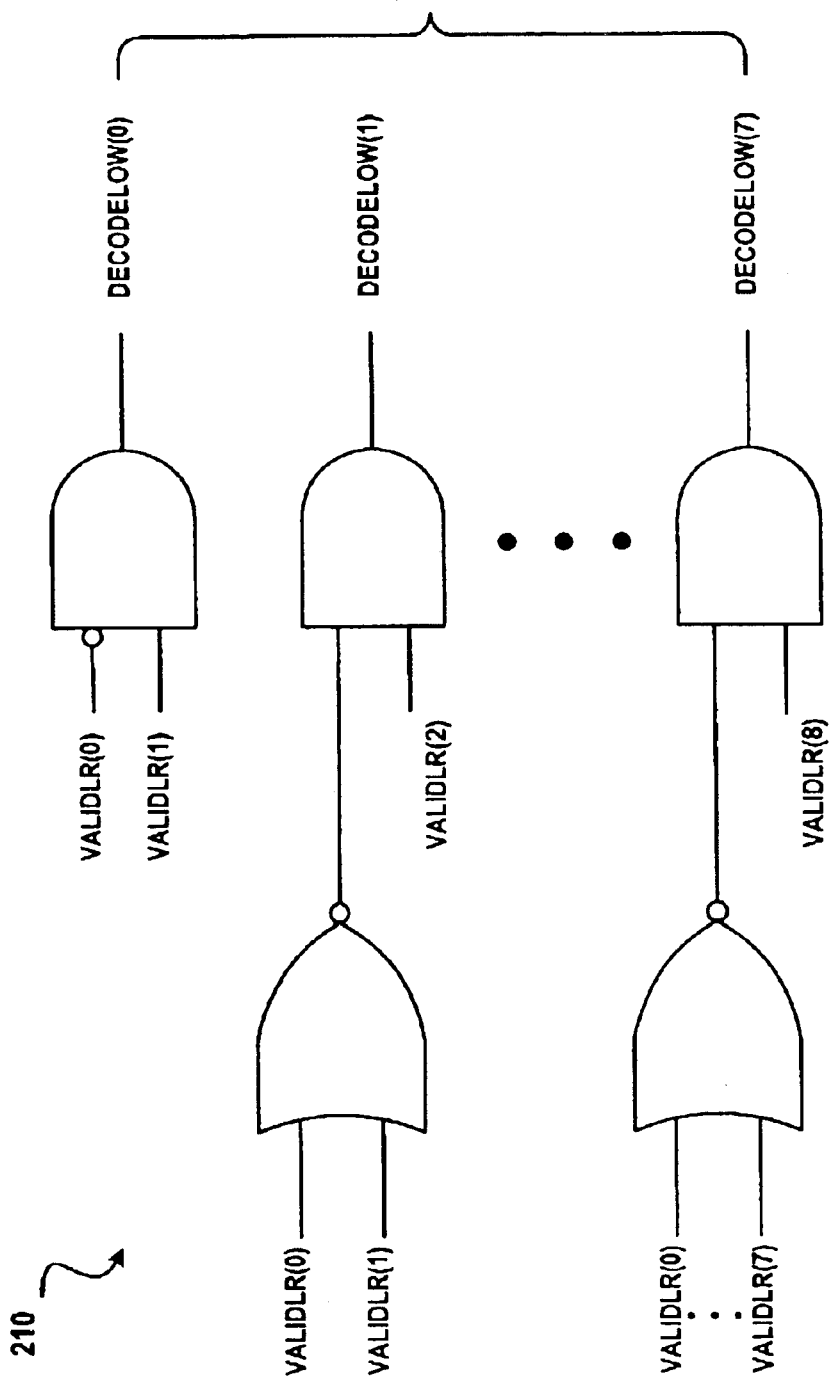
FIG. 7 is a series of logic trees for the pre-detection stage of the logic scheme for the left-priority encoder of FIG. 5.
Figure 8A:
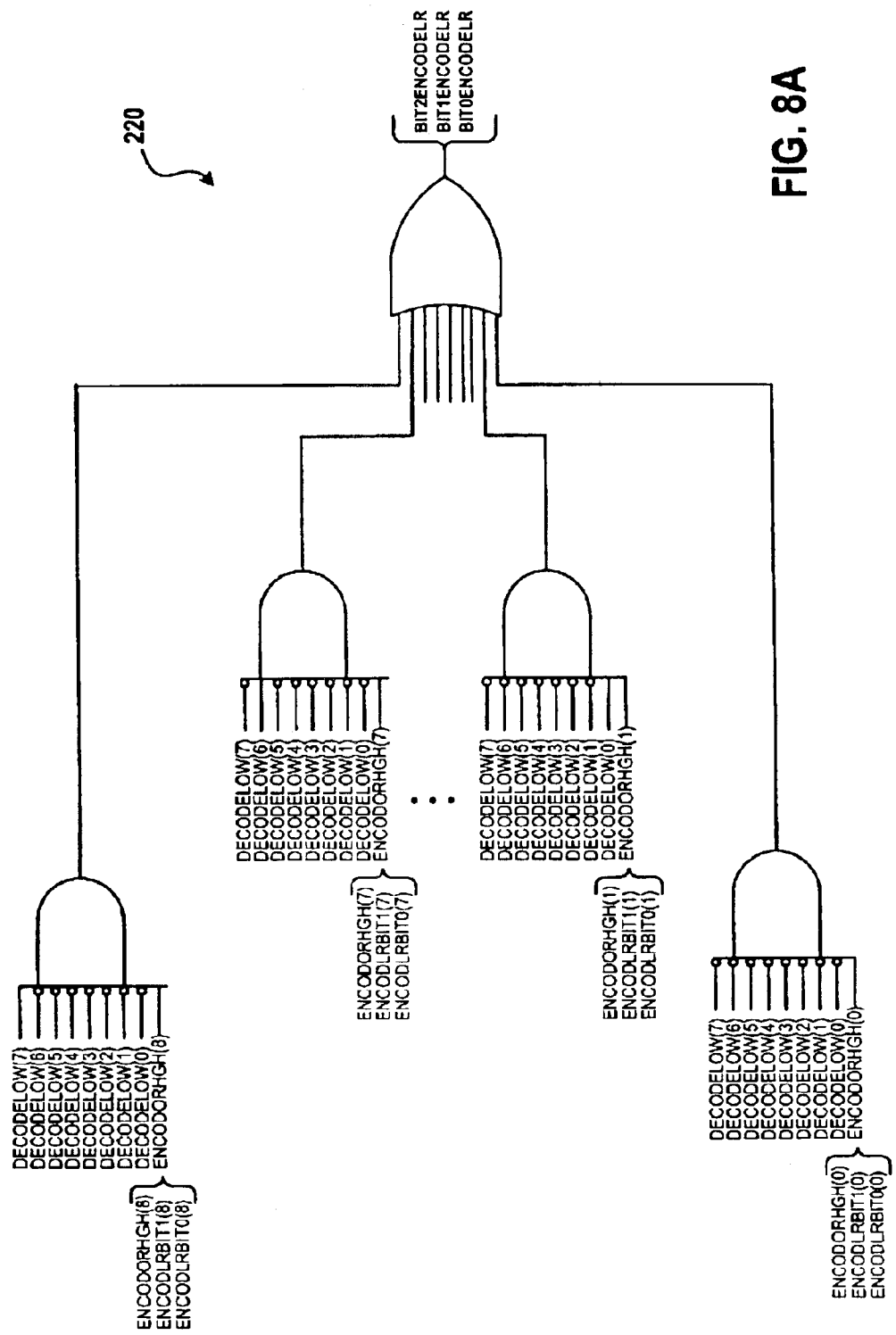
FIGS. 8A and 8B are a series of logic trees for the encode stage of the logic scheme for the left-priority encoder of FIG. 5.
Figure 8B:
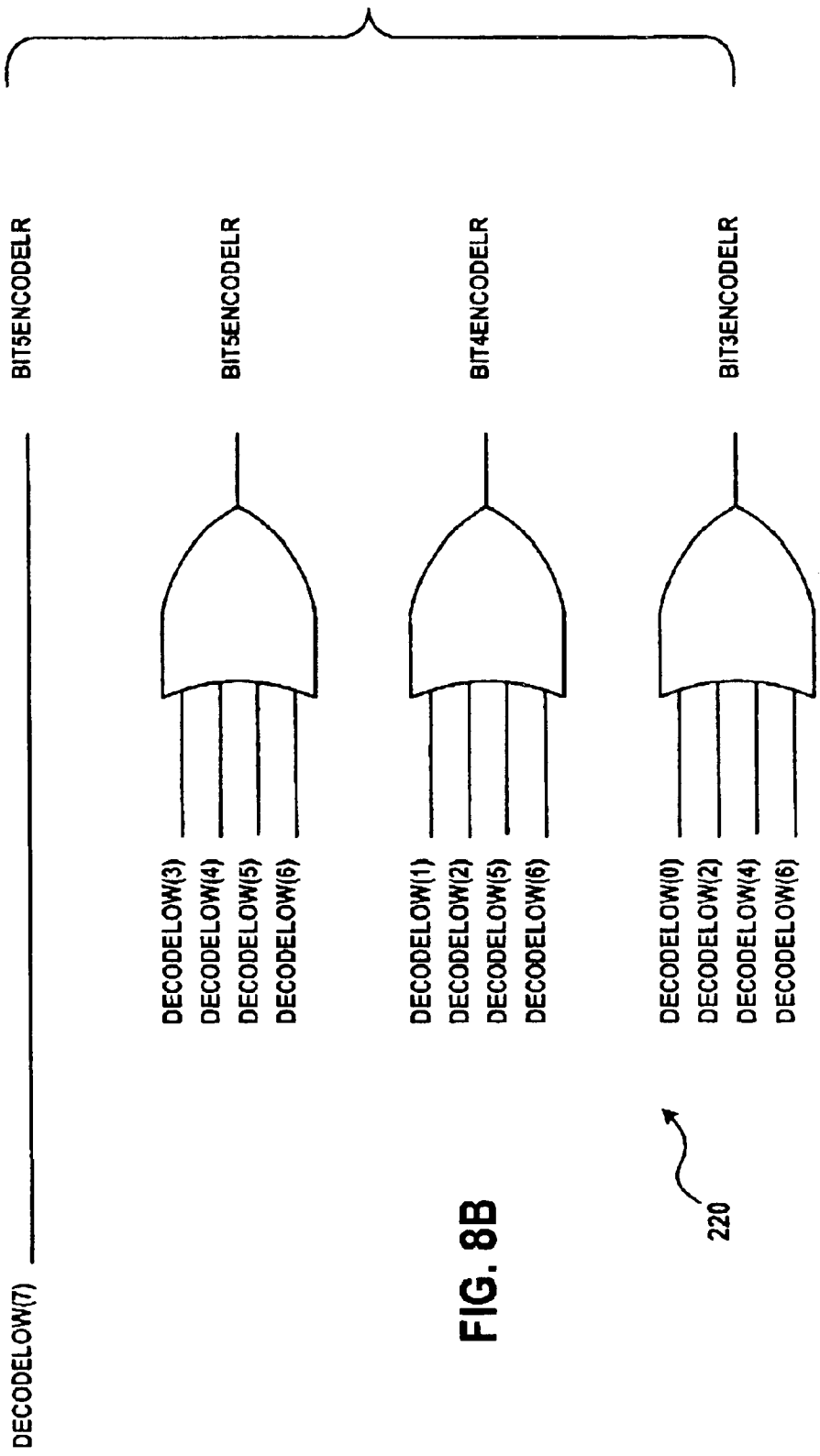

Referring to FIGS. 5–7, FIG. 7 shows logic 210 for pre-detection stage 204 of left-priority encoder 136 (FIG. 3). Logic 210 uses the variables VALIDLR(0–8) to arrive at seven variables, DECODELOW(0) through DECODELOW (7). As can be seen, DECODELOW(0) is the result of ANDing together the inverse of VALIDLR(0) with VALIDLR(1). In subsequent DECODELOW determinations, two or more VALIDLR values are NORed with one another before being ANDed with the corresponding next successive VALIDLR value. The seven DECODELOW values are used in conjunction with ENCODORHGH (0–8), ENCODLRBIT1 (0–8), and ENCODLRBIT0(0–8) in encode stage 206 to encode the location of the first SCF encountered from the left of the word.

Referring to FIGS. 5–8, FIGS. 8A and 8B shows logic 220 for encode stage 206. As discussed above, each bit location in a 72-bit word can be encoded into a 7-bit value. Encode stage 206 includes logic for determining the encoded value for the first failing bit on a bit-by-bit bases. The bits of the encoded value are denoted, from high order bit to low order bit, BIT6ENCODLR, BIT5ENCODLR, BIT4ENCODLR, BIT3ENCODLR, BIT2ENCODLR, BIT1ENCODLR, and BIT0ENCODLR. In the example above wherein left-priority encoder encoded bit location 8 of the 72-bit word failed, the values of these bits would be:

BIT6ENCODLR=0;
BIT5ENCODLR=0;
BIT4ENCODLR=0;
BIT3ENCODLR=1;
BIT2ENCODLR=0;
BIT1ENCODLR=0; and
BIT0ENCODLR=1.

Figure 9:
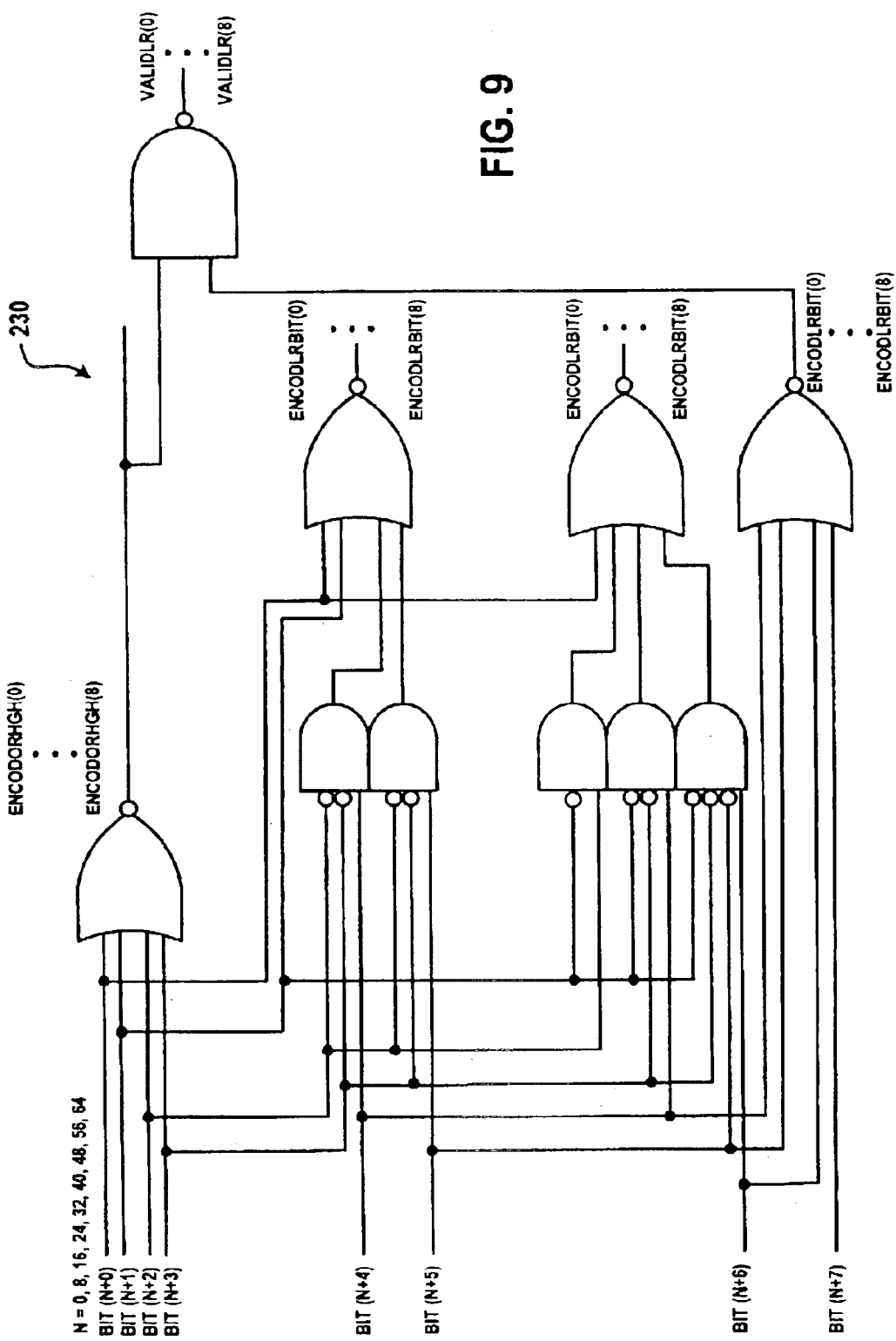
FIG. 9 is a logic tree for the error detection stage of a logic scheme for a right-priority encoder.

The logic for right-priority encoder 140 (FIG. 3) is generally the same as logic 200 for left priority encoder 136, except that the logic trees (FIG. 6) for error detection stage 202 would be replaced with the logic trees 230 shown in FIG. 9. The logic for the decode and encode stages of right-priority encoder are generally the same as decode and encode stages for left-priority encoder (see FIGS. 7 and 8), except that the variable names will include the notation "RL" in place of "LR."

Referring to FIG. 3, since left- and right-priority encoders 136, 140 provide information that allow BIST controller 128 to determine only that one or more than one SCF is present in each word, greater-than-two detector 144 may be used to determine whether or not more than two SCFs are present in that word. As mentioned above, if more than two SCFs are present in a word, the row 108 containing these SCFs is flagged as a must-fix row, since only two spare columns 116 are provided and three or more failing columns in a row can be repaired only by replacement with spare row 120. However, if only one or two SCFs are present in a word, then FAR 148 can store their locations for further testing of memory 104. For example, as BIST system 124 steps through memory word by word, later-tested words crossing a column 112 containing a prior-identified SCF may also contain an SCF in that column. In that event, since only one spare row 120 is provided, each column 112 of memory 104 containing at least two SCFs must be replaced with one of spare columns 116, if any are available. In this case, the failing columns 112 would be flagged with a flag in the must-fix column field 168 of the corresponding column 152 of FAR 148. Similarly, testing of additional words in a row 108 already known to contain at least one SCF may indicate that the row contains one or more additional SCFs. Once the total number of SCFs in a row 108 exceeds two, BIST controller 128 may set a flag in must-fix row field 104 of FAR 148 indicating that row 108 must be fixed with spare row 120. If spare row 120 is not available, memory 104 is not fixable.

Figure 10:
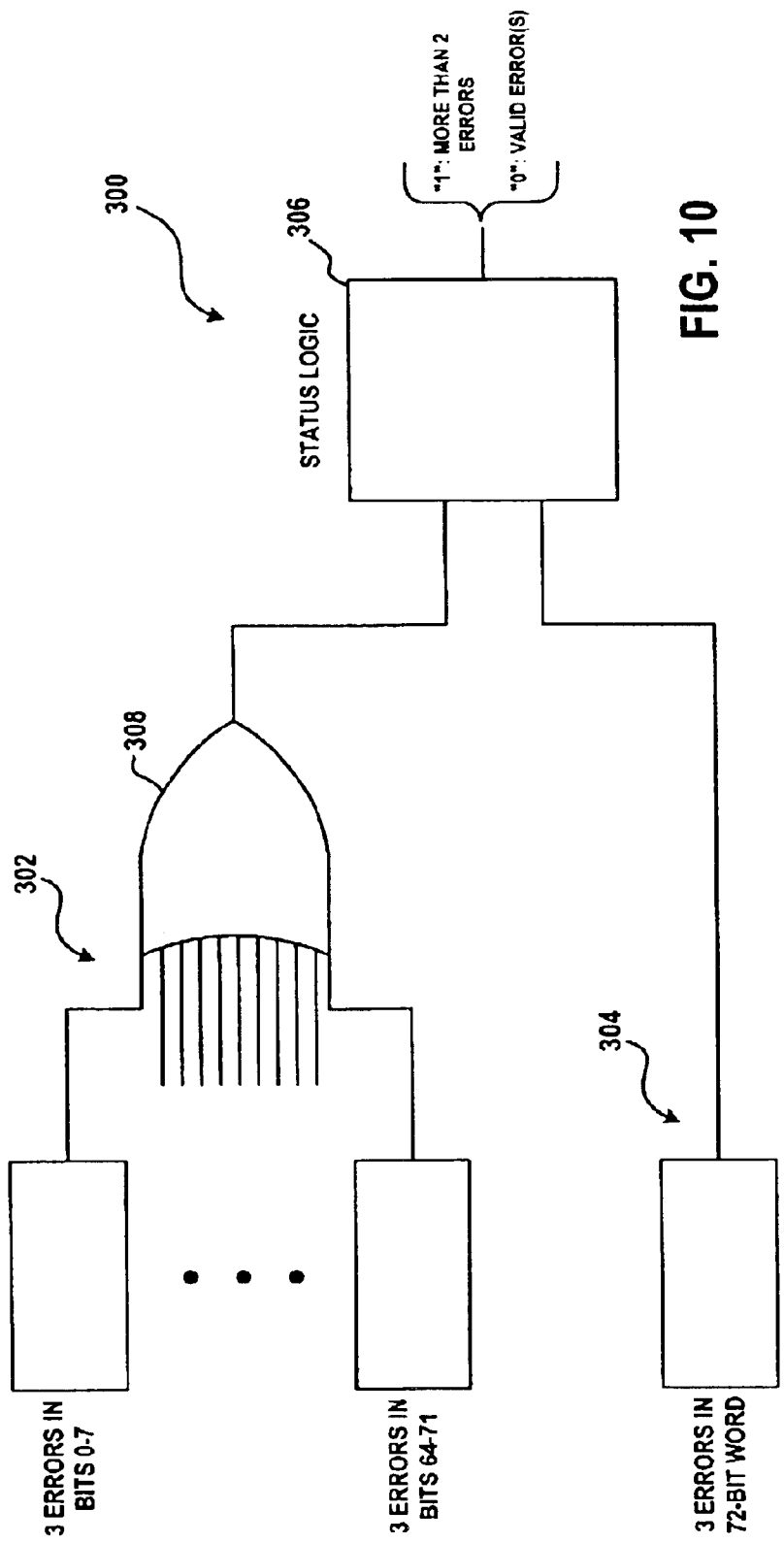
FIG. 10 is a simplified schematic diagram illustrating an overview of a logic scheme for a greater-than-two detector that may be used in conjunction with the BIST system of FIG. 3.

FIG. 10 shows an overview of an exemplary logic 300 for greater-than-two detector 144 (FIG. 3) in the context of a 72-bit word. Logic 300 may include a first branch 302 for detecting whether or not any one of the nine bytes has more than two SCF, and a second branch 304 for detecting whether or not more than two SCF occur in the entire 72-bit word. The results obtained from these two branches may then analyzed in status logic 306, which determines if the left-to-right and right-to-left encoded values from left- and right-priority encoders 136, 140 (FIG. 3) are valid, i.e., truly represent SCFs. If the output of status logic 306 is a "0," then the zero, one, or two SCFs identified by left- and right-priority encoders 136, 140 is valid. However, if one or both outputs of first and second branches 302, 304 indicates that more than two SCFs were detected, the output of status logic 306 will be "1," indicating that more than two SCFs exist in that word. Consequently, the row of memory (FIG. 3) containing these failures can only be fixed with a redundant row, if available. FIGS. 11 and 12A–12I show, respectively, logic 400 that may be used for first branch 302 and logic 500 that may be used for second branch 304 of logic 300 of FIG. 10.

Figure 11:
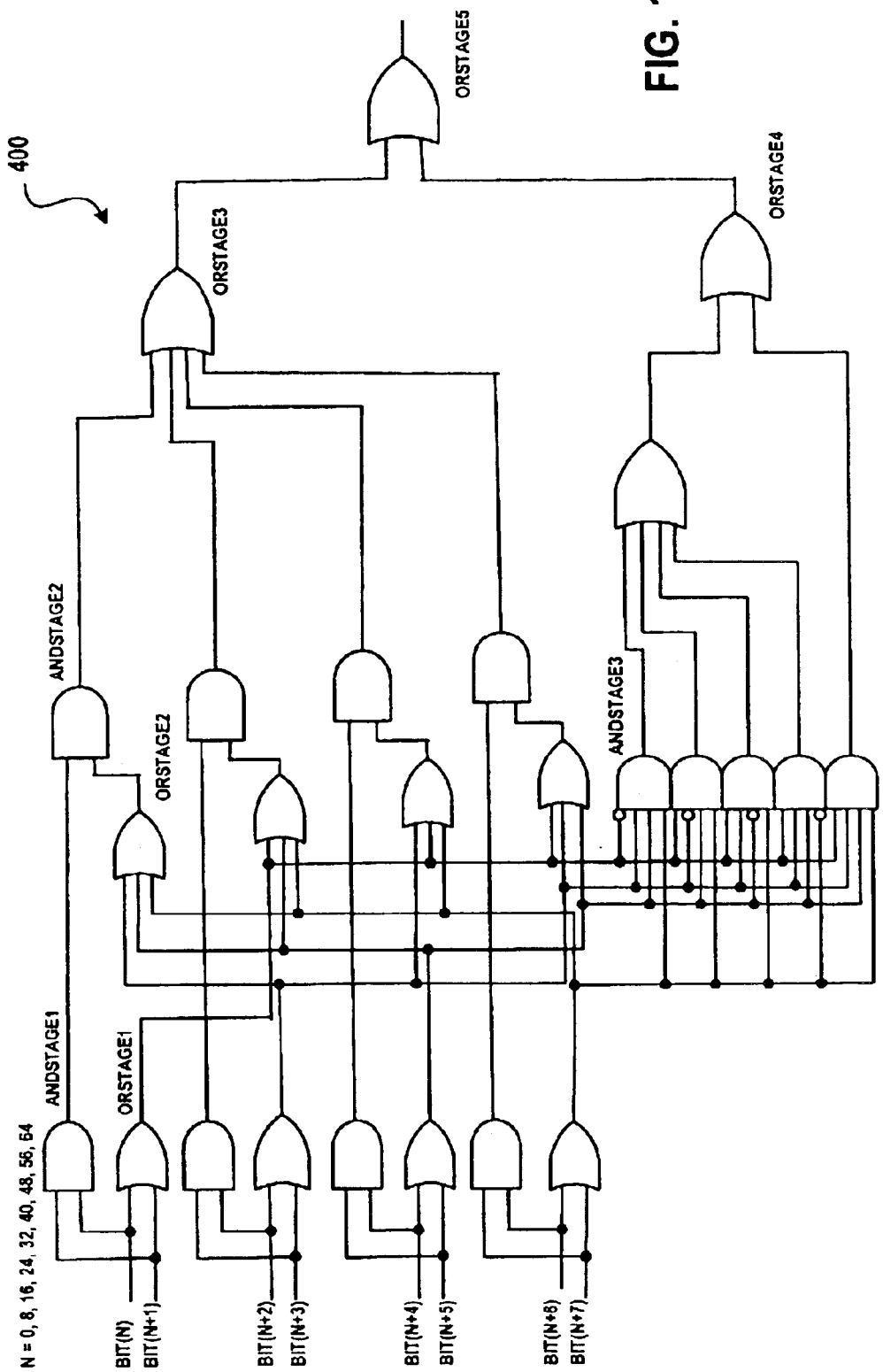
FIG. 11 is a logic diagram for the three errors in a byte detection branch of the logic scheme for the greater-than-two detector of FIG. 10.
Figure 12A:
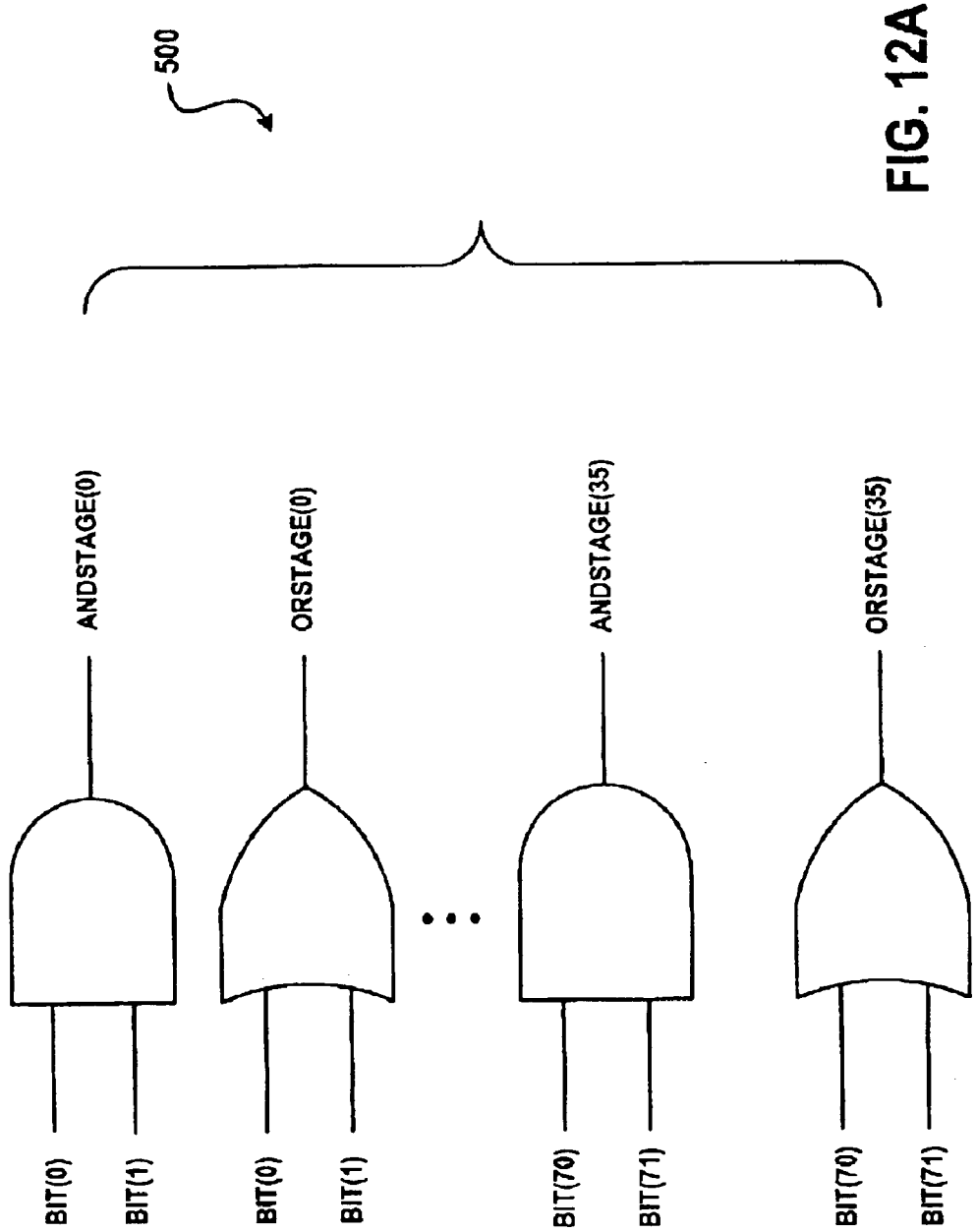
FIGS. 12A–12I are logic diagrams for the three errors in a word detection branch of the logic scheme for the greater-than-two detector of FIG. 10.
Figure 12B:
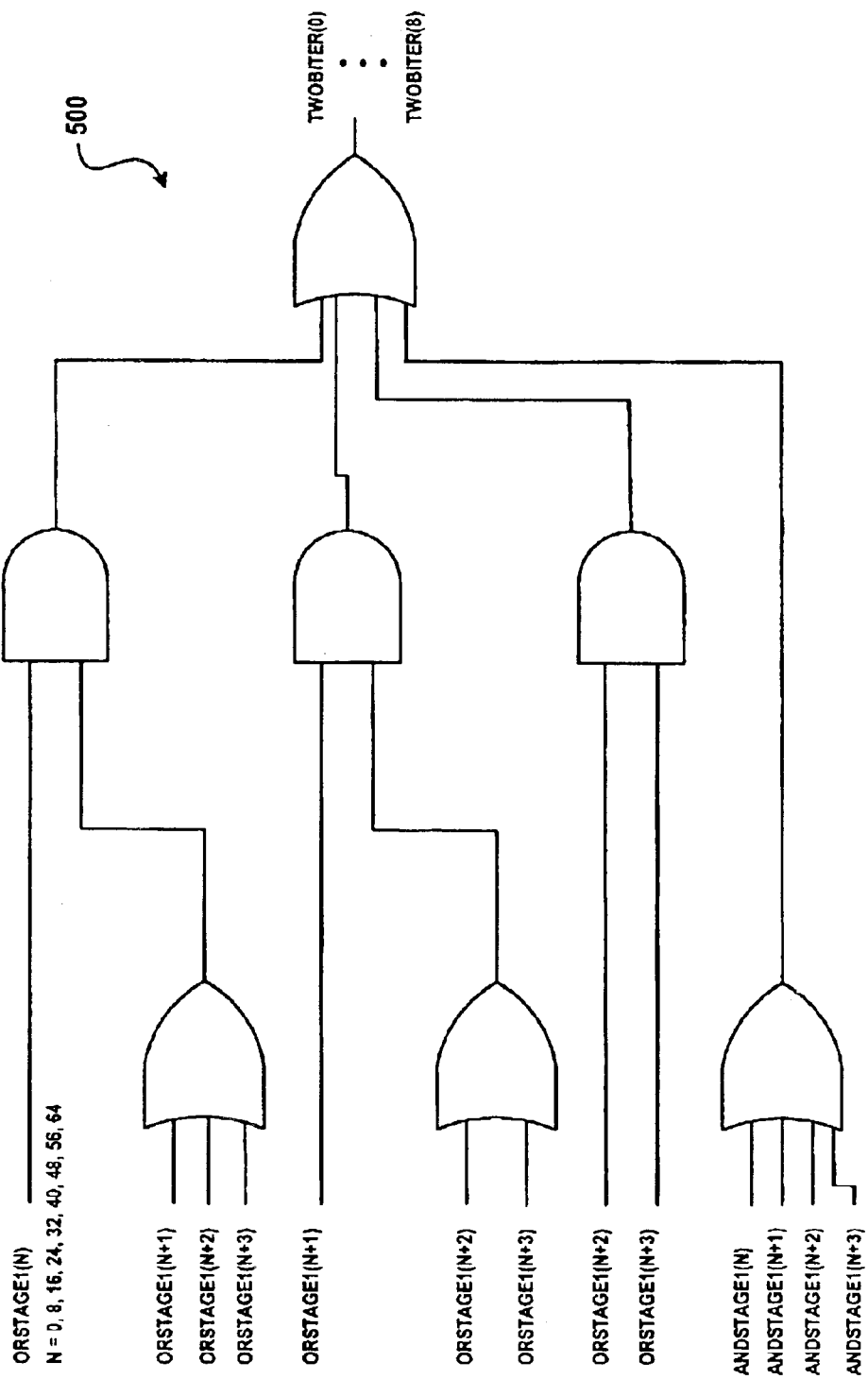
Figure 12C:
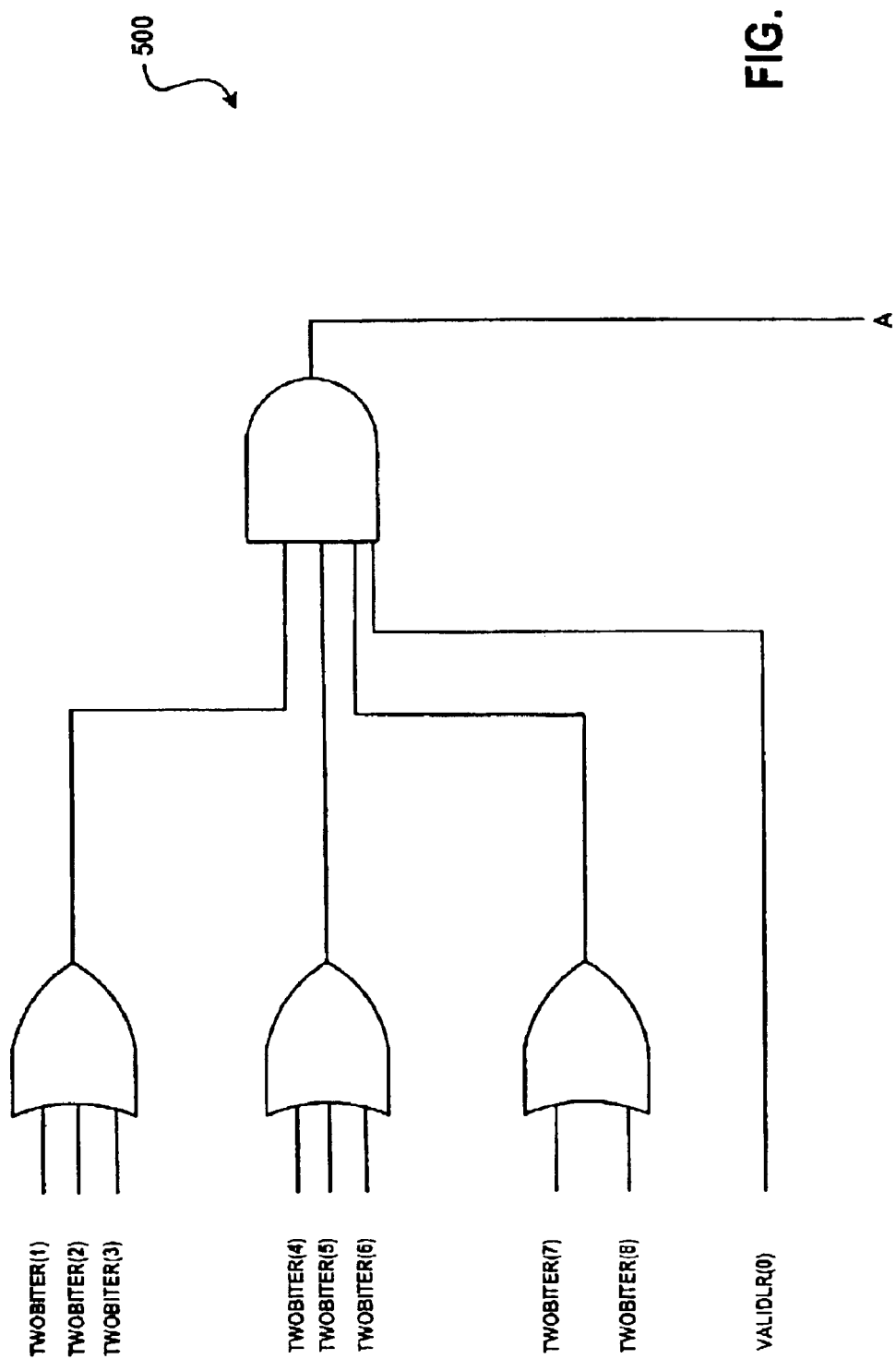
Figure 12D:
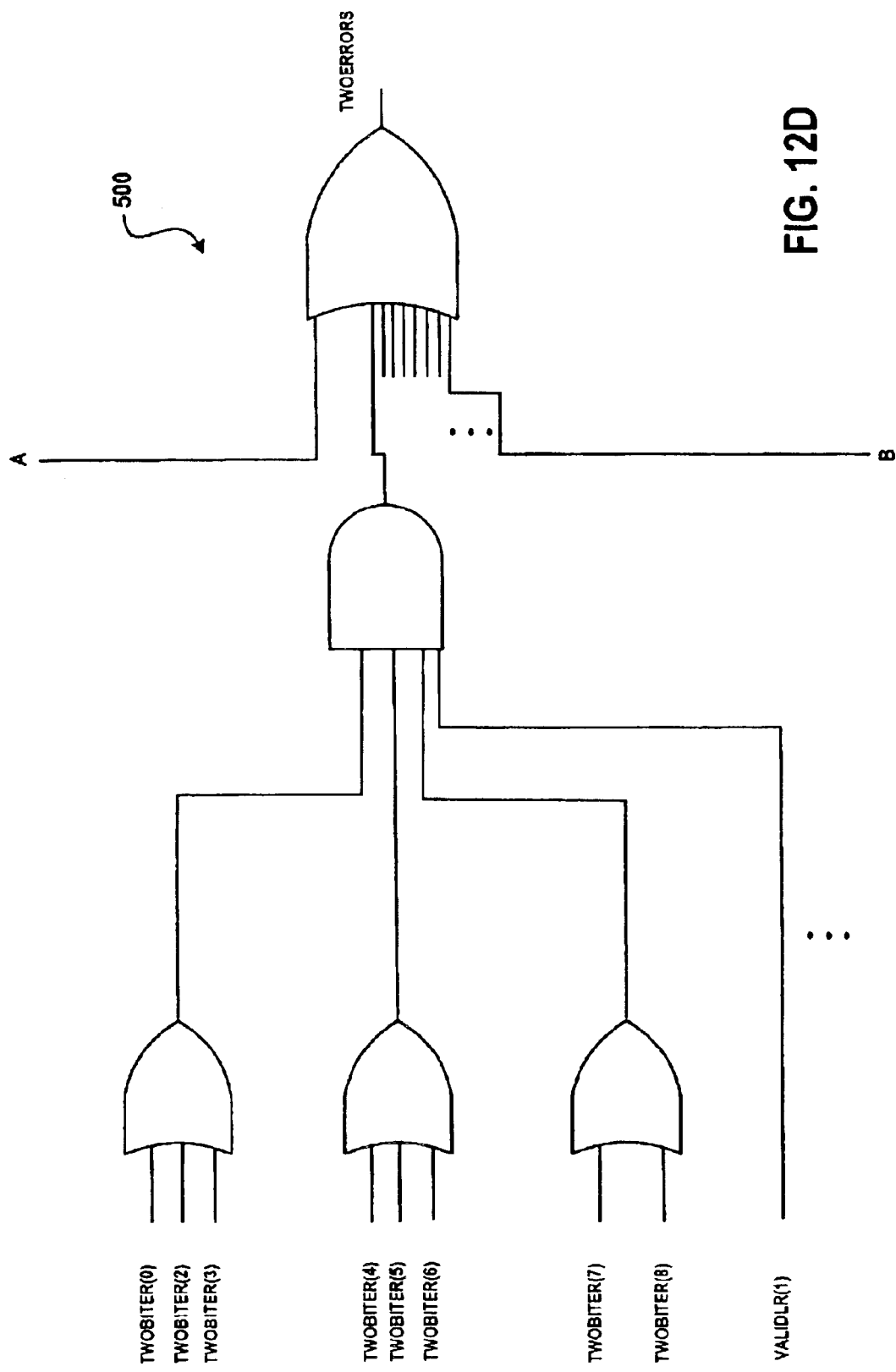
Figure 12E:
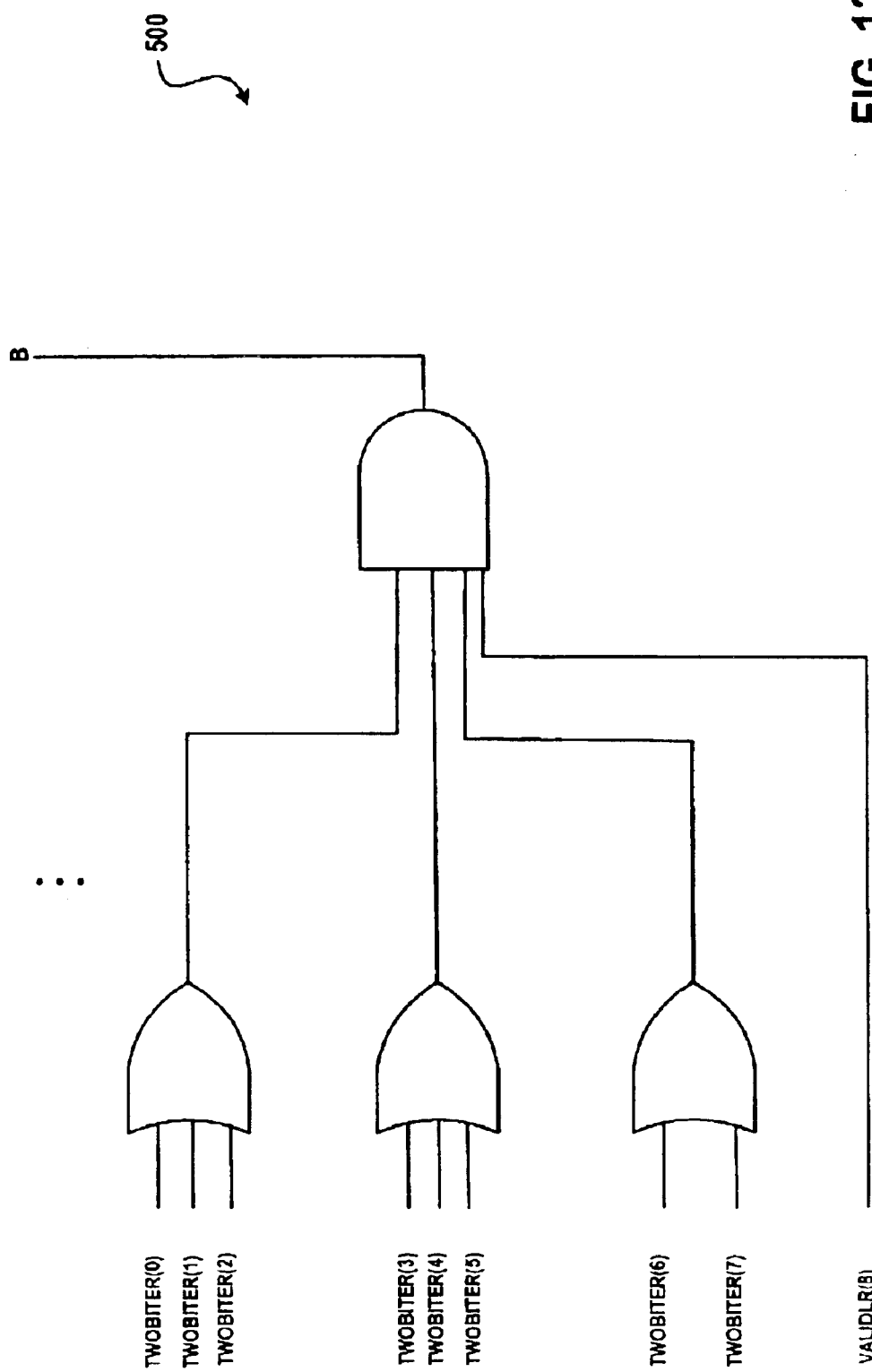
Figure 12F:
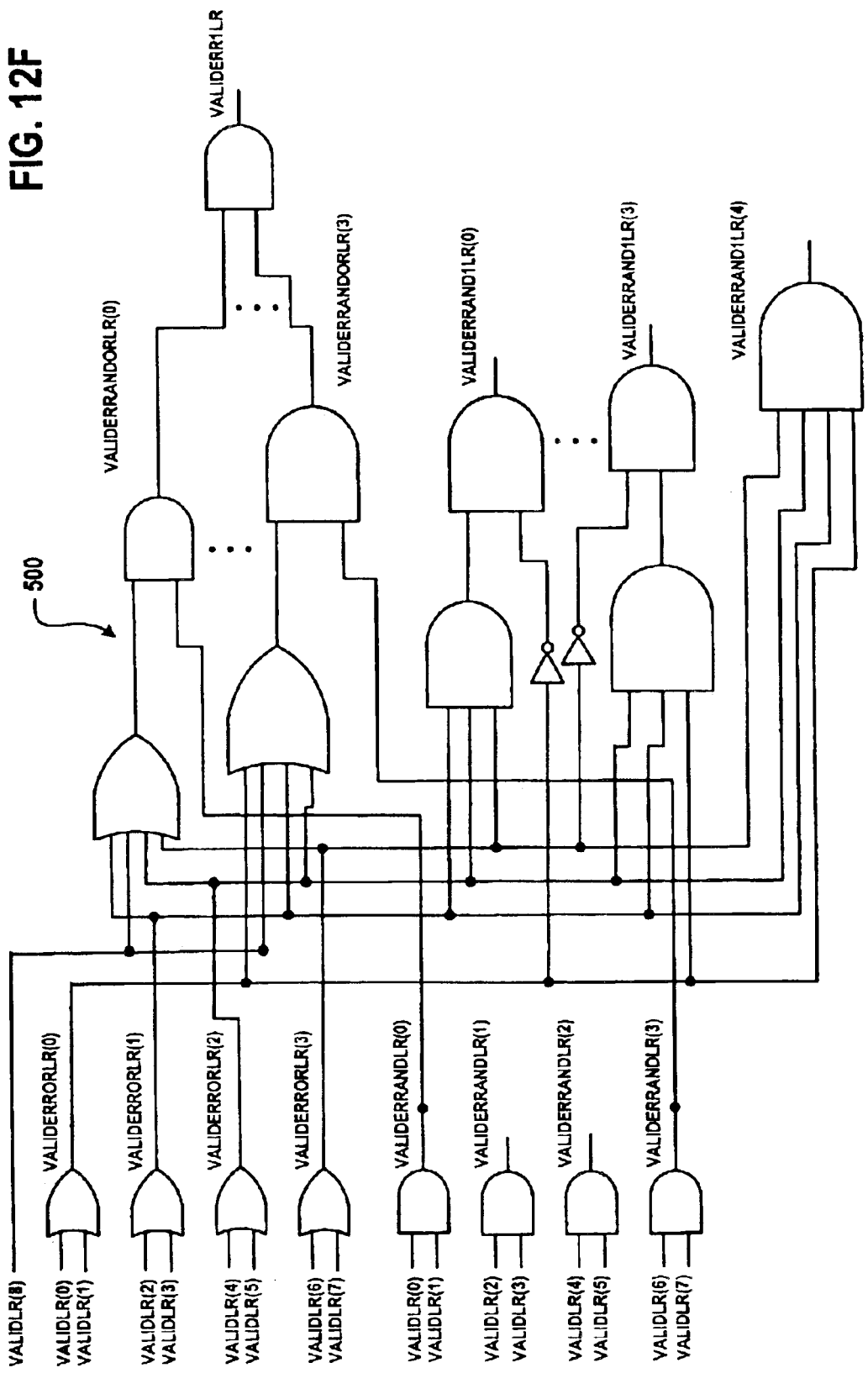
Figure 12G:
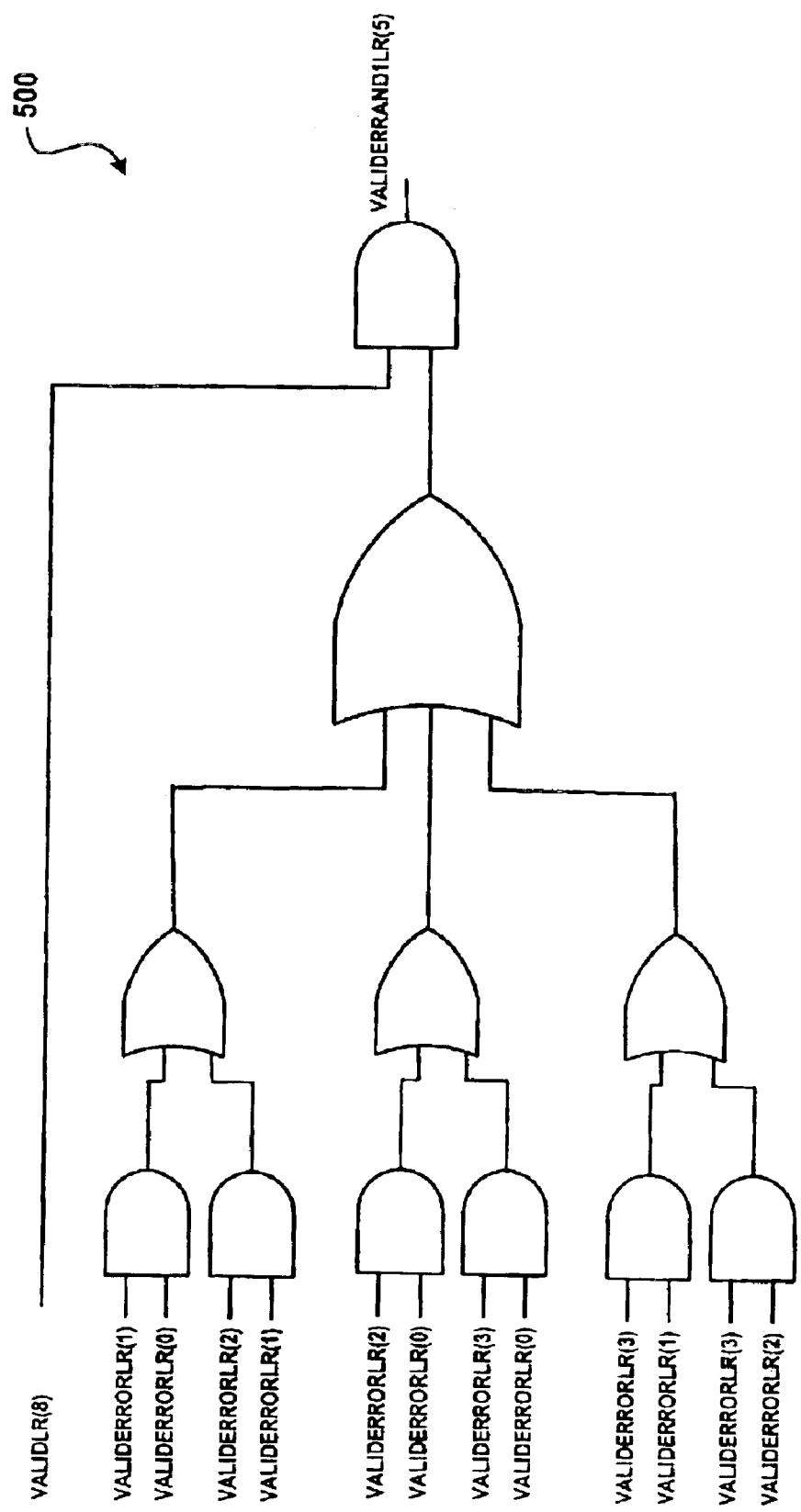
Figure 12H:
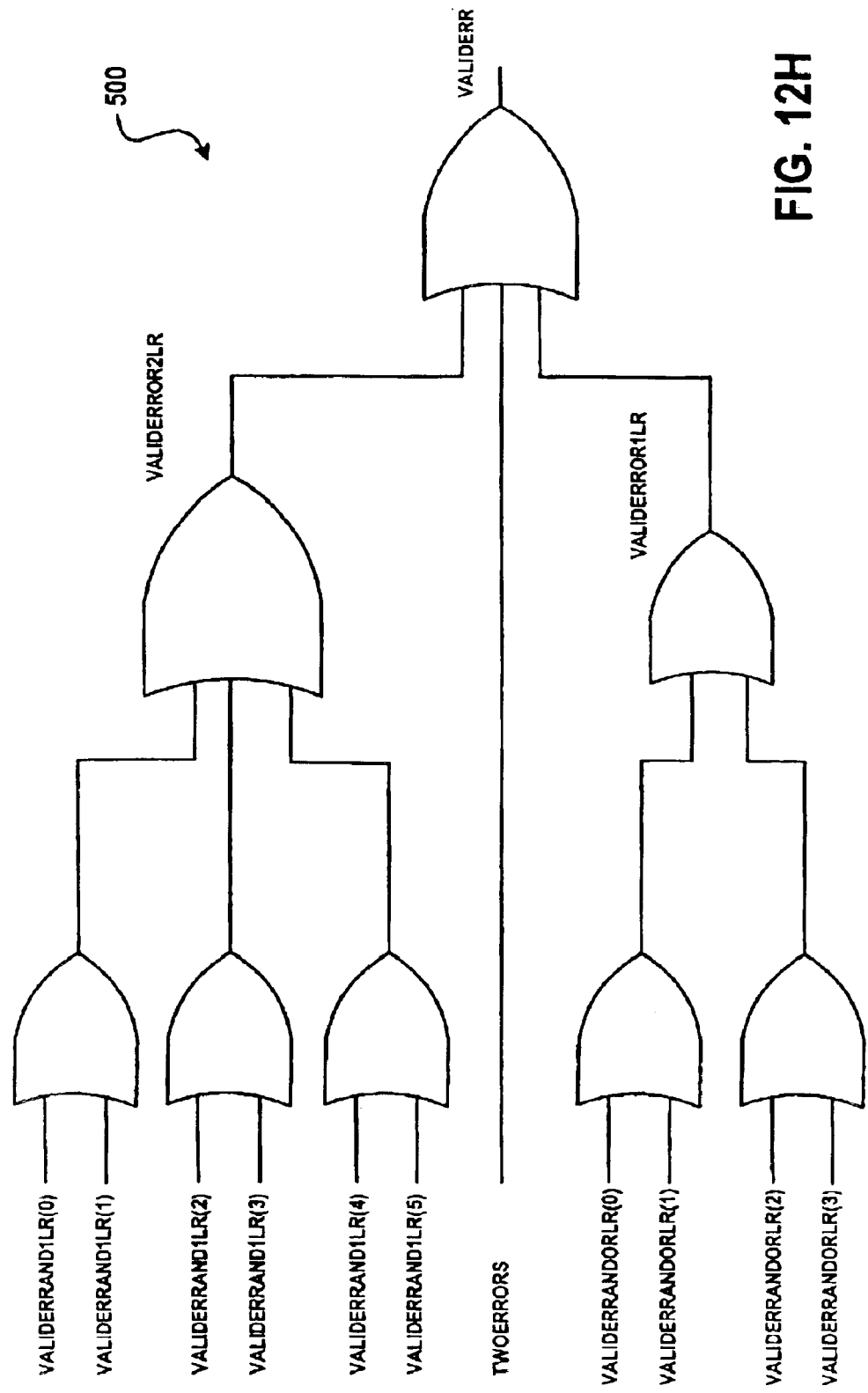
Figure 12I:
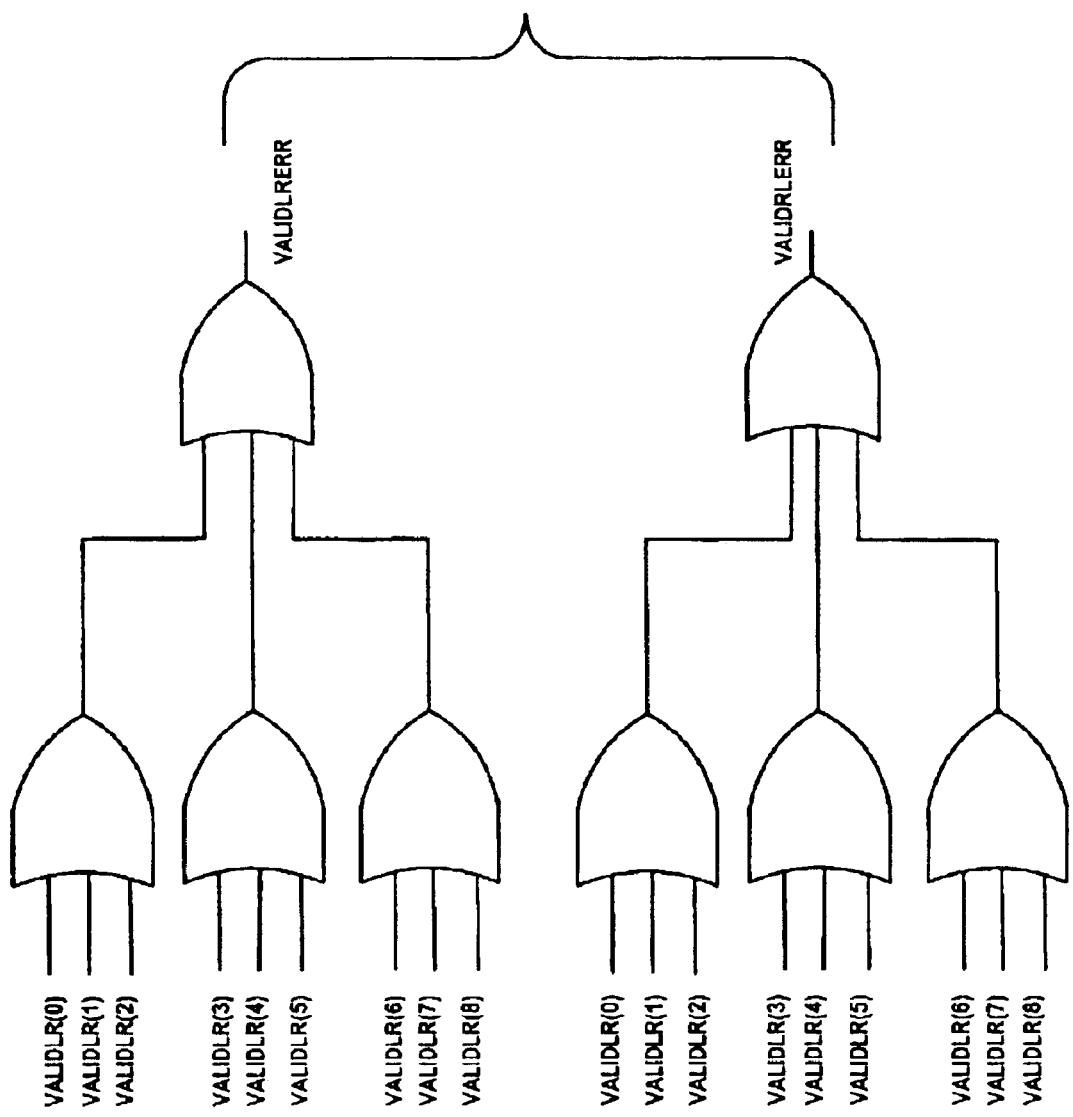

As can be seen from FIGS. 10 and 11, logic 400 of first branch 302 utilizes bit values for each byte of the 72-bit word being analyzed. The output of logic 400 is either a "0" indicating that the corresponding byte has fewer than three SCFs, or a "1" indicating that the byte has at least three SCFs. The outputs of logic 400 for all nine bytes of the 72-bit word are ORed together at OR gate 308 in first branch 302 of logic 300. The output of OR gate 308 is sent to status logic 306. Of course, if the output of OR gate 308 is high, at least one of the bytes of the 72-bit word has at least three errors so that status logic 306 would output a "1" indicating that the encoded left-to-right values are not valid and that the row 108 (FIG. 3) containing these errors is a must fix row.

Referring to FIGS. 6 and 10–12, FIGS. 12A–12I show logic 500 of second branch 304 of logic 300 for determining if more than three SCFs occur in the entire 72-bit word. As will be readily appreciated, individual bytes of the 72-bit word may each have fewer than three errors, yet the entire word may have three or more SCFs. For example, if three separate byte have one SCF each, the entire word will have three SCFs, indicating a must fix row (if two redundant columns 116 (FIG. 3) are provided). Logic 500 utilizes as inputs the error values of bits 0 through 71 of the 72-bit word, the variables VALIDLR(0–8) from error detection stage 202 of logic 200 for left-priority encoder 136, and ORSTAGE(0–7) and ANDSTAGE(0–7) of logic 400 of first branch 302 of logic 300. The output of logic 500 includes the variables VALIDERR, VALIDLRERR, and VALIDRLERR, which are inputs into status logic 306. If more than three SCFs exist in the entire 72-bit word, then all three of these outputs will be high. However, if the 72-bit word contains three or fewer SCFs, then only VALIDLRERR and VALIDRLERR will be high.

While the present invention has been described in connection with a preferred embodiment, it will be understood that it is not so limited. On the contrary, it is intended to cover all alternatives, modifications, and equivalents as may be included within the spirit and scope of the invention as defined above and in the claims appended hereto.

What is claimed is:

1. An integrated circuit device, comprising:
   a) a memory that includes a plurality of redundant columns and a plurality of words each having a most significant bit location and a least-significant bit location;
   b) a built-in self test system for detecting failed bit locations within said memory, said built-in self test system including:
      i) a first encoder for generating a first encoded value corresponding to a first failed bit location most proximate said most significant bit location;
      ii) a second encoder for generating a second encoded value corresponding to a second failed bit location most proximate said least-significant bit location; and
      iii) a built-in self test for allocating at least one of said plurality of redundant columns based upon said first and second encoded values.

2. An integrated circuit device according to claim 1, wherein said built-in self test system further includes a pass/fail comparator for determining whether or not each of said plurality of words contains one or more failed bit locations.

3. An integrated circuit device according to claim 1, wherein said built-in self test system further includes a detector for detecting that at least one of said plurality of words has more failed bit locations than the number of said plurality of redundant columns.

4. An integrated circuit device according to claim 3, wherein said detector is a greater-than-two detector.

5. An integrated circuit device according to claim 3, wherein said memory includes at least one spare row and said greater-than-two detector generates a signal that causes said built-in self test device to allocate said at least one spare row when said at least one of said plurality of words has more than two failed bit locations.

6. An integrated circuit device according to claim 1, wherein said built-in self test device further includes a failed address register for storing said first and second encoded values.

7. An integrated circuit device according to claim 6, wherein said failed address register includes a must-fix column field.

8. An integrated circuit device according to claim 7, wherein said failed address register includes a must-fix row field.

9. An integrated circuit device according to claim 6, wherein said failed address register includes a plurality of valid data fields, said built-in self test system further comprising a pass/fail comparator for populating populate at least some of said plurality of valid data fields.

10. A method of testing a memory of an integrated circuit device and allocating one or more of a plurality of redundant elements to one or more failed bit locations, comprising the steps of:
    a) testing a plurality of word locations within the memory;
    b) performing a most-significant bit encode with respect to each of said plurality of word locations having at least one failed bit location; and
    c) performing a least-significant bit encode with respect to each of said plurality of word locations having at least one failed bit location.

11. A method according to claim 10, further comprising the step of allocating at least one of the plurality of redundant elements to one or more failed bit locations based upon said most-significant and least-significant bit encodes.

12. A method according to claim 10, further comprising the step of determining whether or not at least one of said plurality of word locations has more failed bit locations than number of redundant columns.

13. A method according to claim 10, wherein the memory has two redundant columns and the step of determining whether or not at least one of said plurality of word locations has more failed bit locations than number of redundant columns includes determining whether or not said at least one of said plurality of word locations has more than two failed bit locations.

14. A method according to claim 10, further comprising the steps of storing each of said most-significant and least-significant encodes in a failed address register.

15. A method according to claim 10, wherein steps a, b, and c are performed on board the integrated circuit device.

16. A system for testing a memory of an integrated circuit device and allocating one or more of a plurality of redundant elements to one or more failed bit locations, the system comprising:
    a) a built-in self tester for testing a plurality of word locations within the memory;
    b) a first encoder for performing a most-significant bit encode with respect to each of said plurality of word locations having at least one failed bit location; and
    c) a second encoder for performing a least-significant bit encode with respect to each of said plurality of word locations having at least one failed bit location;
    wherein said first and second encoder are in electrical communication with said built-in self tester.

17. A system according to claim 16, wherein said built-in self tester is for allocating at least one of the plurality of redundant elements to one or more failed bit locations based upon said most-significant and least-significant bit encodes.

18. A system according to claim 16, further comprising a detector for determining whether or not at least one of said plurality of word locations has more failed bit locations than number of redundant columns.

19. A system according to claim 16, wherein the memory has two redundant columns and said detector is a greater-than-two detector.

20. A system according to claim 16, further comprising a failed address register in electrical communication with said built-in tester, said failed address register for storing each of said most-significant and least-significant encodes.

* * * * *